(12) United States Patent
Bedell et al.

(10) Patent No.: US 10,636,837 B2
(45) Date of Patent: Apr. 28, 2020

(54) SOLUTION DEPOSITED MAGNETICALLY GUIDED CHIPLET DISPLACEMENT

(71) Applicant: International Business Machines Corporation, Armonk, NY (US)

(72) Inventors: Stephen W. Bedell, Wappingers Falls, NY (US); Ning Li, White Plains, NY (US); Frank R. Libsch, White Plains, NY (US); Devendra K. Sadana, Pleasantville, NY (US); Bing Dang, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/804,823

(22) Filed: Nov. 6, 2017

(65) Prior Publication Data

US 2018/0211992 A1    Jul. 26, 2018

Related U.S. Application Data

(60) Provisional application No. 62/451,014, filed on Jan. 26, 2017.

(51) Int. Cl.
*G01N 33/00* (2006.01)
*G01R 31/26* (2020.01)
(Continued)

(52) U.S. Cl.
CPC .......... *H01L 27/156* (2013.01); *H01L 24/05* (2013.01); *H01L 24/83* (2013.01); *H01L 24/95* (2013.01); *H01L 33/005* (2013.01); *H01L 33/0095* (2013.01); *H01L 33/48* (2013.01); *H01L 24/29* (2013.01); *H01L 24/32* (2013.01); *H01L 33/62* (2013.01); *H01L 2224/04026* (2013.01); *H01L 2224/0566* (2013.01); *H01L 2224/05655* (2013.01); *H01L 2224/05657* (2013.01); *H01L 2224/29109* (2013.01); *H01L 2224/29111* (2013.01); *H01L 2224/29113* (2013.01); *H01L 2224/29144* (2013.01);
(Continued)

(58) Field of Classification Search
CPC ...... H01L 24/95; H01L 25/0753; H01L 24/83
See application file for complete search history.

(56) References Cited

U.S. PATENT DOCUMENTS

| | | | | |
|---|---|---|---|---|
| 5,709,745 A | * | 1/1998 | Larkin | C30B 25/02 117/96 |
| 6,780,696 B1 | * | 8/2004 | Schatz | H01L 24/95 257/688 |

(Continued)

OTHER PUBLICATIONS

Talghader, et al., "Integration of Fluidically Self Assembled Optoelectronic Devices Using a Silicon Based Process", IEEE Photonics Technogy Letters, Nov. 1995, vol. 7, No. 11, pp. 1321-1323.

*Primary Examiner* — Brian Turner
(74) *Attorney, Agent, or Firm* — Scully, Scott, Murphy & Presser, P.C.; L. Jeffrey Kelly, Esq.

(57) ABSTRACT

Magnetic regions of at least one of a chiplet or a receiving substrate are used to permit magnetically guided precision placement of a plurality of chiplets on the receiving substrate. In the present application, a solution containing dispersed chiplets is employed to facilitate the placement of the dispersed chiplets on bond pads that are present on a receiving substrate.

18 Claims, 3 Drawing Sheets

(51) Int. Cl.
*H01L 33/36* (2010.01)
*H01L 33/62* (2010.01)
*H01L 25/075* (2006.01)
*H01L 27/15* (2006.01)
*H01L 33/00* (2010.01)
*H01L 33/48* (2010.01)
*H01L 23/00* (2006.01)

(52) U.S. Cl.
CPC ............ *H01L 2224/29147* (2013.01); *H01L 2224/32225* (2013.01); *H01L 2224/83085* (2013.01); *H01L 2224/83138* (2013.01); *H01L 2224/83143* (2013.01); *H01L 2224/83192* (2013.01); *H01L 2224/83801* (2013.01); *H01L 2224/83948* (2013.01); *H01L 2224/95085* (2013.01); *H01L 2224/95144* (2013.01); *H01L 2924/1032* (2013.01); *H01L 2924/1037* (2013.01); *H01L 2924/10252* (2013.01); *H01L 2924/10253* (2013.01); *H01L 2924/10271* (2013.01); *H01L 2924/12041* (2013.01); *H01L 2933/0066* (2013.01)

(56) References Cited

U.S. PATENT DOCUMENTS

| | | | |
|---|---|---|---|
| 7,172,789 B2 | 2/2007 | Smith et al. | |
| 7,931,063 B2 | 4/2011 | Craig et al. | |
| 8,816,361 B1* | 8/2014 | Huang | H01L 31/056 257/82 |
| 2002/0013008 A1* | 1/2002 | Sanaka | H01L 24/95 438/15 |
| 2003/0176017 A1* | 9/2003 | Sanaka | H01L 24/95 438/107 |
| 2006/0134799 A1* | 6/2006 | Sharma | H01L 24/95 436/174 |
| 2007/0093006 A1* | 4/2007 | Basol | H01L 21/02491 438/150 |
| 2007/0132086 A1* | 6/2007 | Agraharam | H01L 23/522 257/696 |
| 2007/0269914 A1* | 11/2007 | Yeh | H01L 24/83 438/26 |
| 2008/0297453 A1* | 12/2008 | Ray | H01L 27/3281 345/82 |
| 2010/0060553 A1* | 3/2010 | Zimmerman | H01L 25/0753 345/60 |
| 2010/0122654 A1* | 5/2010 | Sharma | H01L 24/95 118/69 |
| 2010/0163904 A1* | 7/2010 | Park | H01L 33/20 257/98 |
| 2011/0151588 A1* | 6/2011 | Ashdown | H01L 21/6835 438/3 |
| 2013/0126890 A1* | 5/2013 | Bedell | H01L 27/1218 257/76 |
| 2016/0380158 A1* | 12/2016 | Sasaki | H01L 33/483 257/89 |
| 2017/0133550 A1* | 5/2017 | Schuele | H01L 33/0079 |
| 2017/0345983 A1* | 11/2017 | Hsieh | H01L 25/0753 |
| 2018/0190614 A1* | 7/2018 | Kumar | H01L 24/83 |

\* cited by examiner

SOLUTION DEPOSITED MAGNETICALLY GUIDED CHIPLET DISPLACEMENT

RELATED APPLICATION

The present application claims benefit of U.S. Provisional Application 62/451,014, filed Jan. 26, 2017, the entire content and disclosure of which are incorporated herein by reference.

BACKGROUND

The present application relates to a method that enables the precise placement of chiplets containing a semiconductor device layer, such as, for example, a light emitting diode (LED), on a receiving substrate.

A light emitting diode (LED) is a two-lead semiconductor light source. An LED is a p-n junction diode, which emits light when activated. When a suitable voltage is applied to the leads, electrons are able to recombine with electron holes within the device, releasing energy in the form of photons. This effect is called electroluminescene, and the color of the light (corresponding to the energy of the photon) is determined by the energy band gap of the semiconductor material used to provide the p-n junction.

There is an interest in fabricating high resolution display technology using multiple colored micro-LEDs to form individual pixels. An important challenge lies in the precise placement of individual chiplets corresponding to the different LED colors. Although technologies exist which combine temporary bonding and release of singulated LED containing chiplets, the placement precision required, while retaining high throughput and low-cost, remains lacking.

SUMMARY

Magnetic regions of at least one of a chiplet or a receiving substrate are used to permit magnetically guided precision placement of a plurality of chiplets on the receiving substrate. In the present application, a solution containing dispersed chiplets is employed to facilitate the placement of the dispersed chiplets on bond pads that are present on a receiving substrate.

One aspect of the present application relates to a method of precise placement of chiplets onto a receiving substrate. In one embodiment of the present application, the method includes providing a structure comprising a plurality of bond pads located on a surface of a receiving substrate. Next, a chiplet of a first set of chiplets that is dispersed in a solution is placed upon each bond pad by utilizing magnetic force of attraction. The method can be repeated numerous times to place other types of chiplets on other bond pads that are subsequently formed on the surface of the receiving substrate. In one embodiment, the method can be used to place a first set of LEDs that emit a first color, a second set of LEDs that emit a second color different from the first color, and a third set of LEDs that emit a third color that is different from both the first color and the second color.

DETAILED DESCRIPTION

Figure 1:
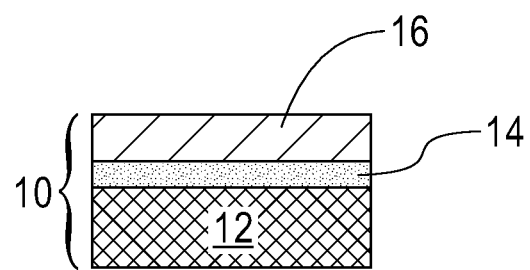
FIG. 1 is a cross sectional view of a chiplet of, from bottom to top, a semiconductor device layer, a contact structure, and a metallic layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a chiplet 10 that can be used in accordance with an embodiment of the present application. The term "chiplet" is used throughout the present application to denote a semiconductor device or circuit that has been selected from a larger substrate and may contain metallization and dielectric regions. Chiplet 10 includes, from bottom to top, a semiconductor device layer 12, a contact structure 14, and a metallic layer 16.

The semiconductor device layer 12 of chiplet 10 includes at least one semiconductor material that has one or more semiconductor devices formed therein or thereupon. The term "semiconductor material" is used throughout the present application to denote a material that exhibits semiconducting properties. Examples of semiconductor materials that can be used to provide the semiconductor device layer 12 include, but are not limited to, silicon (Si), germanium (Ge), silicon germanium alloys (SiGe), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

The semiconductor material that provides the semiconductor device layer 12 may be a single material or a combination of semiconductor materials, without any other type of material located between the semiconductor materials. In some embodiments, a semiconductor-on-insulator including a handle substrate, a buried oxide, and a top semiconductor material may be used as the semiconductor device layer 12.

In one embodiment, the semiconductor device layer 12 includes a light emitting diode (LED) which includes a first semiconductor material of a first conductivity type and a second semiconductor material of a second conductivity type that is opposite from the first conductivity type; other types of semiconductor devices besides LEDs can be used in the present application. In one embodiment, the first semiconductor material is located directly above or directly below the second semiconductor material. In another embodiment, the first semiconductor material is located laterally adjacent and in direct contact with the second semiconductor material. The first and second semiconductor materials of the LED that can be used as the semiconductor device layer 12 include any semiconductor material or combination of semiconductor materials that when a suitable voltage is applied thereto, electrons are able to recombine with electron holes, releasing energy in the form of photons. Depending on the energy band gap of the first and second semiconductor materials, various colors such as, for example, red, blue or green, can be subsequently emitted therefrom. In one embodiment, the first and second semiconductor materials of the LED are both composed of a III-V semiconductor compound material such as for example, GaN or GaAs.

In one embodiment, the first conductivity type is p-type and the second conductivity type is n-type. In another embodiment, the first conductivity type is n-type and the second conductivity type is p-type. The term "p-type" refers to the addition of impurities to an intrinsic semiconductor material that creates deficiencies of valence electrons. "N-type" refers to the addition of impurities that contributes free electrons to an intrinsic semiconductor. The concentration of dopants that provide the first and second conductivity types may be from $1\times10^{18}$ atoms/cm$^3$ to $5\times10^{21}$ atoms/cm$^3$; other dopant concentrations as possible so long as a p-n junction is provided between the first and second semiconductor materials that provide the LED.

The semiconductor device layer 12 can be formed utilizing any well known process. In one embodiment, the semiconductor device layer 12 may be formed utilizing a spalling (i.e., a material removal process). Spalling is a useful technique in creating thin film devices by fracturing a surface of a crystalline substrate through use of stress created by differences in material properties of the material to be fractured and a stressor material. In embodiments in which spalling is employed, a base semiconductor substrate containing at least one material that provides the semiconductor device layer 12 is first provided: other device components may be formed upon the base semiconductor substrate. Next, a stressor layer such as a layer of nickel is formed on top of the base semiconductor substrate, wherein the stressor layer is deposited to a thickness sufficient to permit mechanically-assisted spalling of the base semiconductor substrate. A handle layer such as an adhesive tape is then formed on stressor layer and thereafter a spalled structure including a portion of the base semiconductor substrate is removed from the original base semiconductor substrate by pulling the handle layer away from the base semiconductor substrate.

The semiconductor device layer 12 may have a thickness from 100 nm to 20 microns. Other thicknesses that are lesser than, or greater than, the aforementioned thickness values may also be used as the thickness of the semiconductor device layer 12.

The contact structure 14 is formed on a first surface of the semiconductor device layer 12. In some embodiments, the contact structure 14 may be formed on the material(s) that provides the semiconductor device layer 12 prior to, or after, performing a spalling process. In one embodiment and as illustrated, the contact structure 14 is a continuous material layer that is present on an entirety of the semiconductor device layer 12. In another embodiment (not illustrated in FIG. 1), the contact structure 14 is composed of discrete regions that are spaced apart from each other by a gap. Although not shown in the drawings of the present application, another contact structure can be formed on a second surface of the semiconductor device layer 12, wherein the second surface is opposite the first surface.

The contact structure 14 (and, if present the other contact structure) may include any ohmic metal or metal alloy. The ohmic metal or metal alloy that provides the contact structure 14 may be the same as, or different from, the ohmic metal or metal alloy that provides the other contact structure. Examples of ohmic metals or metal alloys that may be employed in providing the contact structure 14 (and, if present the other contact structure) include, but are not limited to, nickel, gold, silver, cobalt, aluminum, titanium, tungsten, palladium, platinum, or nickel silver. The contact structure 14 (and, if present the other contact structure) may be formed by first providing a blanket layer of an ohmic metal or metal alloy. The blanket layer of ohmic metal or metal alloy can be formed utilizing a deposition process such as, for example, chemical vapor deposition, plasma enhanced chemical vapor deposition, physical vapor deposition, atomic layer deposition, sputtering or plating. In embodiments in which the contact structure 14 is composed of discrete contact structures, a patterning process can be used. In one embodiment, patterning may be performed by lithography and etching. Lithography includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used.

The contact structure 14 (and, if present the other contact structure) may have a thickness from 10 nm to 500 nm. Other thicknesses that are lesser than, or greater than, the aforementioned thickness values may also be used as the thickness of the contact structure 14 (and, if present the other contact structure).

The metallic layer 16 is formed on a surface of the contact structure 14 which is opposite the surface of the contact structure that is in contact with the semiconductor device layer 12. In some embodiments, the metallic layer 16 may formed prior to, or after, performing a spalling process. In embodiments in which the metallic layer 16 is formed prior to spalling, the metallic layer 16 can be used, in such an instance, as a stressor material of the spalling process.

In one embodiment, the metallic layer 16 is composed of a material that has magnetic properties (i.e., a magnetic material). In one embodiment of the present application, the magnetic material that may provide the metallic layer 16 is composed of a magnetic metal or metal alloy such as, for example, magnetic nickel, magnetic cobalt, magnetic iron or magnetic alloys thereof. In one embodiment, the magnetic material that provides the metallic layer 16 is composed of magnetic nickel.

In another embodiment, the metallic layer 16 is composed of a metal or metal alloy that has non-magnetic properties. Examples of non-magnetic metals or metal alloys that may be employed as metallic layer 16 include, but are not limited to, titanium, copper, tungsten, palladium, platinum and alloys thereof.

The metallic layer 16 may be formed by first providing a blanket layer of magnetic or non-magnetic material. The blanket layer of magnetic or non-magnetic material can be formed utilizing a deposition process such as, for example, chemical vapor deposition, plasma enhanced chemical vapor deposition, physical vapor deposition, atomic layer deposition, sputtering or plating. A patterning process such as, for example, lithography and etching, may following the deposition process.

The metallic layer 16 may have a thickness from 100 nm to 30000 nm. Other thicknesses that are lesser than, or greater than, the aforementioned thickness values may also be used as the thickness of the metallic layer 16.

Figure 2:
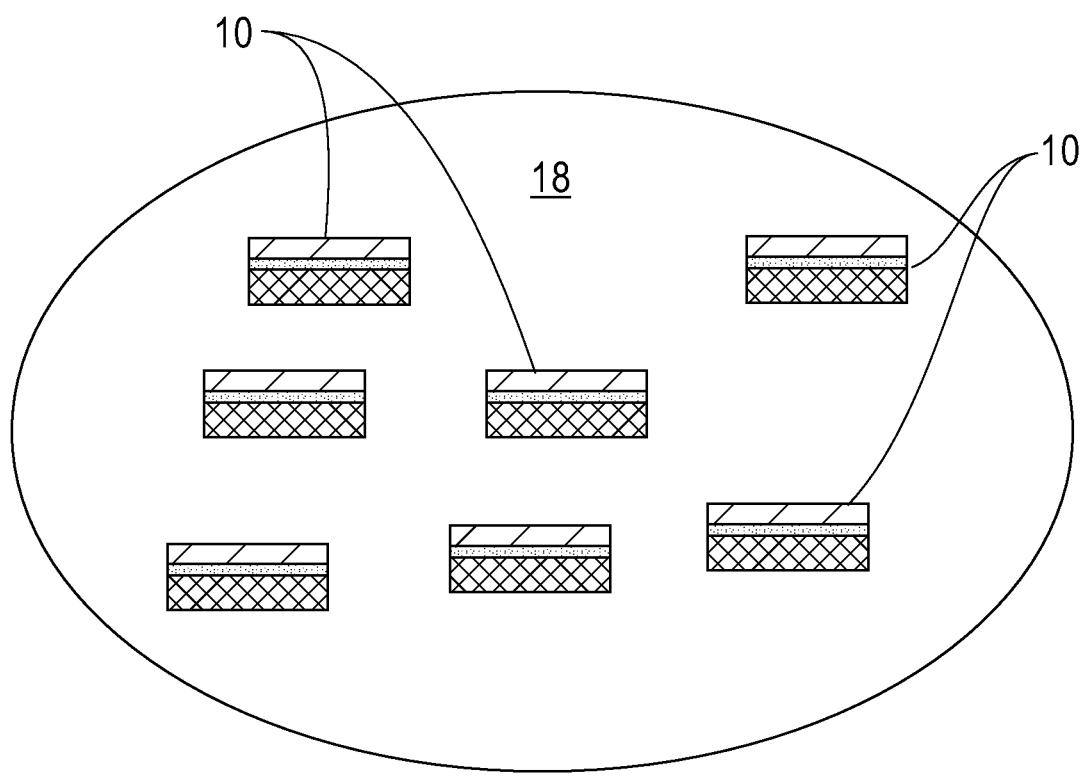
FIG. 2 is a pictorial representation illustrating a plurality of chiplets as shown in FIG. 1 dispersed in a solution.

Referring now to FIG. 2, there is shown a pictorial illustration of a plurality of chiplets 10 as shown in FIG. 1 dispersed in a solution 18. Each chiplet 10 is a first set of chiplets. In one embodiment, each chiplet of the first set of chiplets 10 is an LED that can emit a first color (i.e., one of red, blue or green). Although FIG. 2 illustrates each chiplet 10 of the first set of chiplets dispersed in a controlled orientation, the chiplets 10 are typically randomly oriented in the solution at this point of the present application.

The solution 18 that can be employed to disperse each chiplet 10 of the first set of chiplets may be aqueous or non-aqueous. The solution 18 may include a polar solvent, or a non-polar solvent. The solvent selected should not negatively impact the chiplets or the display substrate and bond pads that are formed thereon. Examples of solvents that can be used in providing the solution 18 include water, or alcohols (ethanol, methanol, isopropanol, glycols, etc.). The solution may contain various other components designed to maximize the zeta potential and prevent particulate agglomeration including, but not limited to, surfactants (e.g., polyethylene glycol, Triton X-100, stearates, etc.), capping particles (amine, carboxylic acid, etc.) and/or dispersing aids (boric acid, polyphosphate, etc.). Such components may be used to prevent or reduce the clumping of the chiplets 10 within the solution 18.

The solution 18 containing the dispersed chiplets 10 of the first set of chiplets can be preparing utilizing techniques well known in the art. In one example, chiplets 10 can be prepared and then added to a suitable solvent by hand or mechanical means. Other components such as surfactants, and/or dispersing aids can be added to the solvent either prior to, or after, addition of the chiplets.

In some embodiments of the present application, the solution 18 may contain a mechanical agitator such as a stirring bar. In yet another embodiment, agitation of the solution 18 containing the chiplets 10 can be facilitated by using ultrasonic agitation.

Figure 3:
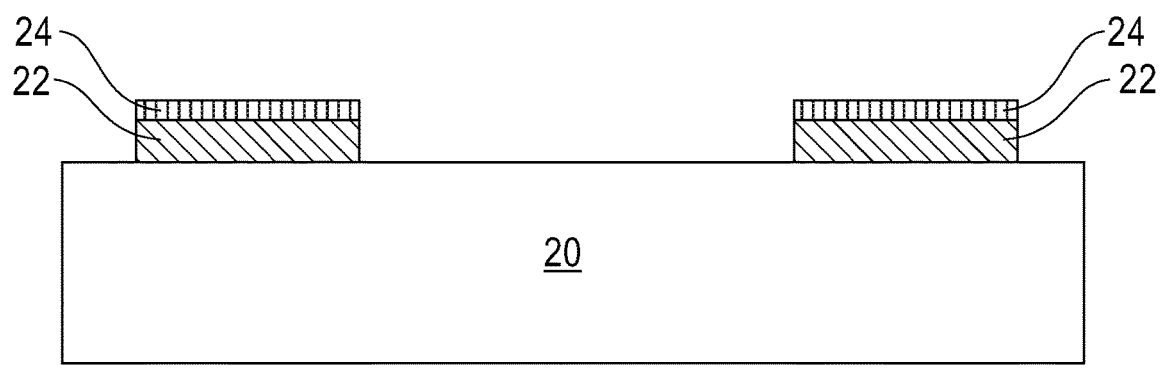
FIG. 3 is a cross sectional view of an exemplary structure including spaced apart bond pads that are located on a surface of a receiving substrate that can be employed in accordance with an embodiment of the present application.

Referring now to FIG. 3, there is illustrated an exemplary structure including spaced apart bond pads 22 (two of which are shown by way of one example in FIG. 3) that are located on a surface of a receiving substrate 20 that can be employed in accordance with an embodiment of the present application. Each bond pad 22 typically has a size and/or shape that matches the same and/or shape of chiplets 10 to be subsequently transferred thereto. Each bond pad 22 is formed on a pre-selected area of the receiving substrate 20.

Receiving substrate 20 (which may also be referred to as a display substrate) may include various materials such as, for example, a semiconductor material (such as defined above), an insulator or any combination thereof. When a semiconductor material is employed as the receiving substrate 20, the semiconductor material may be a single material or a combination of semiconductor materials. In some embodiments, a semiconductor-on-insulator including a handle substrate, a buried oxide, and a top semiconductor material may be used as the receiving substrate 20.

The insulator material that may be employed as the receiving substrate 20 includes any electrical insulating material such as, for example, glass, a ceramic (such as a carbide, an oxide or a nitride), and/or a plastic. The insulator material that can provide the receiving substrate 20 may be composed of a single electrical insulating material or a combination of electrical insulating materials. In some embodiments, a material stack, in any order, of a semiconductor material and an insulator material may be employed as the receiving substrate 20.

The receiving substrate 20 may have a thickness from few microns (e.g., 2 microns) to a few millimeters (e.g., 3 millimeters). Other thicknesses that are lesser than, or greater than, the aforementioned thickness values may be employed as the thickness of the receiving substrate 20.

In one embodiment and as shown in FIG. 3, each bond pad 22 is formed on a topmost, planar surface of the receiving substrate 20. In other embodiments, each bond pad 22 may be formed in an opening formed in the receiving substrate 20 or a mesa portion of the receiving substrate 20. The openings and mesa portions can be formed by patterning the receiving substrate 20. When such embodiments are employed, patterning may include lithography and etching as defined above.

In one embodiment, each bond pad 22 is composed of a material that has magnetic properties (i.e., a magnetic material). In embodiments in which the metallic layer 16 is also composed of a magnetic material, each bond pad 22 is composed of a material that is capable of magnetically attracting the metallic layer 16 of the chiplet 10. That is, for a given metallic layer 16 and a given bond pad 22, the two are arranged such that physically exposed surfaces of each that are facing each other have a different polarity (i.e., north or south). In cases in which the metallic layer is magnetic, the magnetic force of the metallic layer 18 is less than the magnetic force of the bond pad 22 such that subsequent release of the chiplet 10 to the bond pad 22 may take place. In one embodiment, the magnetic material that may provide each bond pad 22 is composed of a magnetic metal or metal alloy such as, for example, magnetic nickel, magnetic cobalt, magnetic iron or magnetic alloys thereof. In one embodiment, the magnetic material that provides each bond pad 22 is composed of magnetic nickel.

In another embodiment, each bond pad 22 is composed of a metal or metal alloy that has non-magnetic properties.

Examples of non-magnetic metals or metal alloys that may be employed as each bond pad 22 include, but are not limited to, titanium, gold, copper, tungsten, palladium, platinum and alloys thereof. In such instances, the metallic layer 16 of the chiplet should be magnetic and an external magnetic force will be subsequently used to release the chiplet 10 to the bond pad 22 on the receiving substrate 20.

Each bond pad 22 may be formed by first providing a blanket layer of magnetic or non-magnetic material. The blanket layer of magnetic or non-magnetic material can be formed utilizing a deposition process such as, for example, chemical vapor deposition, plasma enhanced chemical vapor deposition, physical vapor deposition, atomic layer deposition, sputtering or plating. The magnetic field strength and orientation of the bond pad 22 can be controlled by the orientation and strength of an applied external magnetic field during the aforementioned deposition process of the same. The blanket layer of magnetic or non-magnetic material is then patterned to provide each bond pad 22. Patterning may include lithography and etching as defined above.

Each bond pad 22 may have a thickness from 100 nm to 10000 nm. Other thicknesses that are lesser than, or greater than, the aforementioned thickness values may also be used as the thickness of the each bond pad 22.

In some embodiments, a solder material 24 such as, for example, indium, bismuth, gold, silver, tin or alloys thereof can be formed utilizing conventional techniques that are well known to those skilled in the art on a surface of bond pads 22 prior to subsequent bonding of preselected chiplets to the bond pads 22. In some embodiments, a solder material may be formed on preselected chiplets prior to bonding. In yet another embodiment, solder material can be formed on both the bond pads 22 and preselected chiplets prior to bonding. During a subsequently performed anneal, the solder material forms a soldered joint, i.e., permanent bond, between the preselected chiplets and the bond pads 22.

Figure 4:
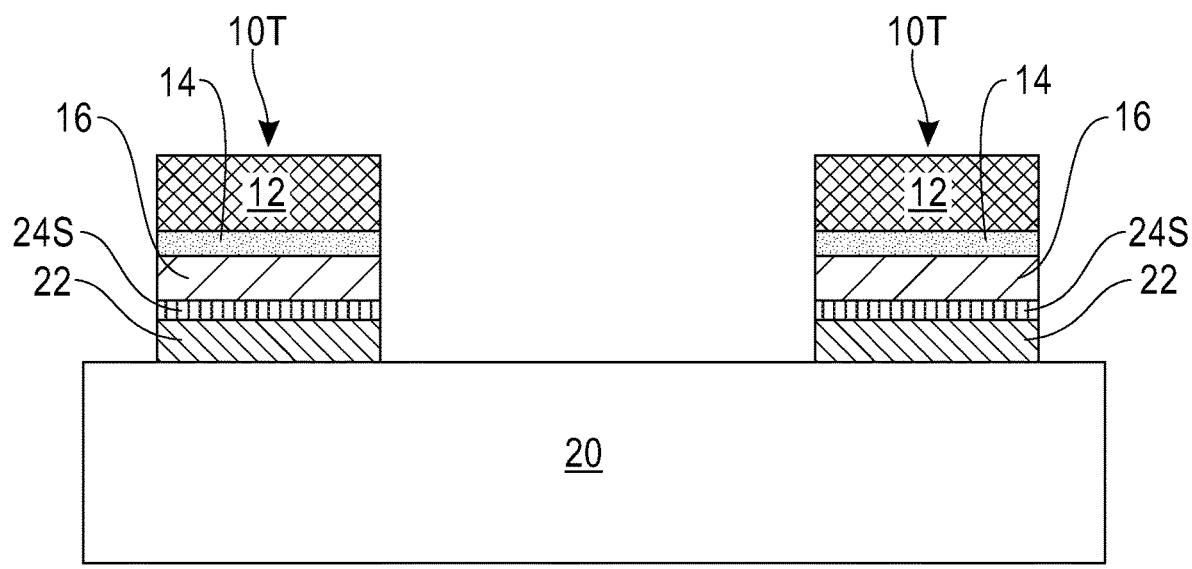
FIG. 4 is a cross sectional view of the exemplary structure FIG. 3 after the precise placement of an individual dispersed chiplet onto each bond pad of the receiving substrate and forming a permanent bond between each transferred chiplet and each bond pad.

Referring now to FIG. 4, there is illustrated the exemplary structures of FIG. 2 after the precise placement of a chiplet 10 of the first set of chiplets that are dispersed in solution onto each bond pad 22 located on the receiving substrate 20 and forming a permanent bond between each transferred chiplet 10T and each bond pad 22; transfer chiplets 10T include the semiconductor device layer 12, the contact structure 14 and the metallic layer 16. In some embodiments, a solder joint 24S is formed between the transfer chiplet 10T and the underlying bond pad 22. The solder joint 24S is composed of the solder material 24 and it is formed after annealing. In some embodiments, permanent bonding is not performed or it can be delayed until additional chiplets of a same or different type are transferred to the receiving substrate 20.

The precise placement includes contacting the exemplary structure shown in FIG. 3 with a solution 18 containing dispersed chiplets 10 such as shown in FIG. 2 in the presence of magnetic force of attraction. In one embodiment, the magnetic attraction is caused by magnetic force of attraction that exists between magnetic materials that comprise both the chiplet 10 and the underlying bond pad 22. In such an embodiment, a magnetic moment is created in the structure that has a controlled orientation. In this embodiment, the controlled orientation means that the polarity of the physically exposed surface of the metallic layer 16, which is to contact the bond pad 22, is opposite from the polarity of the physically exposed surface of the bond pad 22. As is shown in FIG. 4, the transferred chiplets 10T are precisely placed on an underlying bond pad 22 such that the sidewalls of the transferred chiplet 10T are vertically aligned to the sidewalls of the underlying bond pad 22. After the chiplets are transferred to the bond pads 22, the resultant structure may be rinsed with water to remove excess solution 18 and then dried. Drying may be performed by air or by utilizing an elevated temperature which is sufficient to remove the excess solvent.

In some embodiments, an anneal may be performed to provide a permanent bond between the transferred chiplet 10T and the underlying bond pad 22. The anneal may form solder joint 24S as mentioned above. The anneal (i.e., bonding anneal) may be performed at a temperature from 100° C. to 1000° C., depending on the annealing time. Typically higher temperature requires less annealing time. Annealing can be done by rapid thermal anneal (RTP), laser anneal, flash anneal, furnace anneal, or any suitable combination of those techniques. In one embodiment, the anneal is performed at 400° C. for 30 seconds. Other temperatures may also be used as long as the anneal temperature is capable of forming a permanent bond between each transferred chiplet 10T and the underlying bonding pad 22. In some embodiments, the anneal may be performed in an inert ambient such as, for example, helium and/or argon. In other embodiments, the anneal may be performed in a forming gas ambient. The duration of the anneal may vary so long as the duration of the anneal causes the formation of a permanent bond between each transferred chiplet 10T and the underlying bonding pad 22.

The above processing can be repeated any number of times to precisely place other chiplets that are different from transferred chiplets 10T onto other bond pads that are subsequently provided on the receiving substrate 20; typically the processing is repeated at least twice more to provide three different types of chiplets on the receiving substrate which may, in some embodiments, emit different colors (i.e., red, blue and green). The other types of chiplets are dispersed in a solution and then are precisely placed onto the subsequently formed bond pads utilizing magnetic force of attraction as mentioned above.

Figure 5:
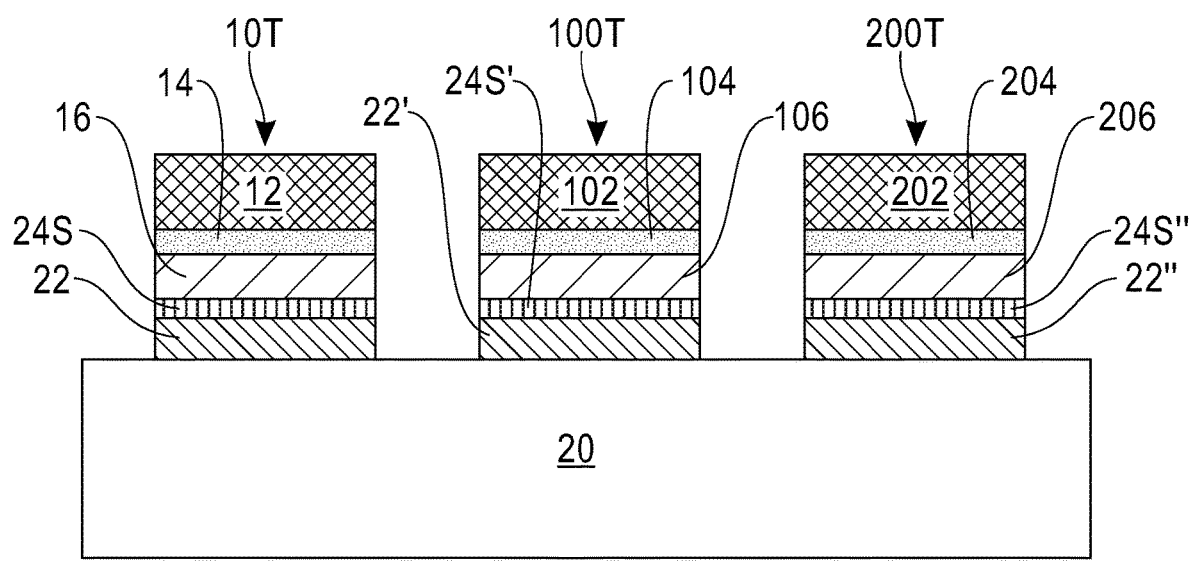
FIG. 5 is a cross sectional view of a portion of the exemplary structure shown in FIG. 4 after the precise placement of other chiplets on other bond pads that are subsequently formed on the receiving substrate by repeating the method of the present application at least twice.

FIG. 5 illustrates a portion of the exemplary structure shown in FIG. 4 including chiplet 10T located on a bond bad 22 that is formed on display substrate 10. Chiplet 10T can emit a first color. Other chiplets (namely 100T and 200T) are then precisely placed onto bond pads 22' and 22", respectively by repeating the processing of the present application. Chiplet 100T is a second chiplet that can emit second color that differs from the first color 10T, while chiplet 200T is a third chiplet that can emit a third color that differs from the both the first and second colors. Chiplet 100T includes a semiconductor device layer 102, a contact structure 104 and the metallic layer 106. Chiplet 200T includes a semiconductor device layer 202, a contact structure 204 and the metallic layer 206. In FIG. 5, elements 24S' and 24S" are both solder joints.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a structure, the method comprising:

forming a plurality of spaced apart first bond pads on a surface of a display substrate; wherein each spaced apart first bond pad of the plurality of first bond pads is composed of a first magnetic material having a first polarity;

forming a solder material on each first bond pad;

providing a solution containing a plurality of a first set of chiplets dispersed therein, wherein each chiplet of the first set of chiplets comprises a first semiconductor device layer comprising a first light emitting diode (LED) that emits a first color, a first contact structure located directly on a surface of the first semiconductor device layer and composed of an ohmic metal-containing material, and a first metallic layer located directly on a surface of the first contact structure and composed of a second magnetic material having a second polarity that is opposite the first polarity, wherein the second magnetic material has a magnetic force of attraction that is less than the first magnetic material;

transferring the first set of chiplets to the plurality of first bond pads by magnetic force of attraction between the first magnetic material and the second magnetic material, wherein one of the chiplets of the first set of chiplets is precisely placed on one of the first bond pads by the magnetic force of attraction; and forming, by annealing, a permanent bond between each transferred first set of chiplets and the first bond pads.

2. The method of claim 1, wherein the first magnetic material is composed of magnetic nickel, magnetic cobalt, magnetic iron or a magnetic alloy thereof.

3. The method of claim 1, wherein the first semiconductor device layer, the first contact structure, and the first metallic layer have sidewall surfaces that are vertically aligned to each other.

4. The method of claim 3, wherein each first bond pad has sidewall surfaces that are vertically aligned to the sidewall surfaces of each of the first semiconductor device layer, the first contact structure, and the first metallic layer.

5. The method of claim 1, wherein the first metallic layer is formed on a surface of the first contact structure after performing a spalling process.

6. The method of claim 1, wherein the first metallic layer is formed on a surface of the first contact structure prior to performing a spalling process, and the first metallic layer serves as a stressor layer during the spalling process.

7. The method of claim 1, wherein the solution is an aqueous solution.

8. The method of claim 1, wherein the solution is a non-aqueous solution.

9. The method of claim 1, wherein the solution comprises a polar solvent.

10. The method of claim 1, wherein the solution comprises a non-polar solvent.

11. The method of claim 1, wherein the solution further comprises at least one component selected from the group consisting of a surfactant, capping particles, and dispersing aids.

12. The method of claim 11, wherein the at least one component is added to the solution prior to adding the first set of chiplets.

13. The method of claim 11, wherein the at least one component is added to the solution after adding the first set of chiplets.

14. The method of claim 1, wherein the second magnetic material is composed of magnetic nickel, magnetic cobalt, magnetic iron or a magnetic alloy thereof.

15. The method of claim 1, wherein each chiplet of the first set of chiplets further comprises a solder material formed thereon prior to the transferring.

16. The method of claim 1, wherein the annealing is performed at a temperature from 100° C. to 1000° C.

17. The method of claim 1, further comprising:

forming a plurality of spaced apart second bond pads on the display substrate; wherein each spaced apart second bond pad of the plurality of second bond pads is composed of a third magnetic material having a third polarity;

forming a solder material on each second bond pad;

providing a solution containing a plurality of a second set of chiplets dispersed therein, wherein each chiplet of the second set of chiplets comprises a second semiconductor device layer comprising a second light emitting diode (LED) that emits a second color that differs from the first color, a second contact structure located directly on a surface of the second semiconductor device layer and composed of an ohmic metal-containing material, and a second metallic layer located directly on a surface of the second contact structure and composed of a fourth magnetic material having a fourth polarity that is opposite the third polarity, wherein the fourth magnetic material has a magnetic force of attraction that is less than the third magnetic material;

transferring the second set of chiplets to the solder material that is present on the plurality of second bond pads by magnetic force of attraction between the third magnetic material and the fourth magnetic material; and forming, by annealing, a permanent bond between each transferred second set of chiplets and the second bond pads.

18. The method of claim 17, further comprising:

forming a plurality of spaced apart third bond pads on the display substrate; wherein each spaced apart third bond pad of the plurality of third bond pads is composed of a fifth magnetic material having a fifth polarity;

forming a solder material on each third bond pad;

providing a solution containing a plurality of a third set of chiplets dispersed therein, wherein each chiplet of the third set of chiplets comprises a third semiconductor device layer comprising a third light emitting diode (LED) that emits a third color that differs from the first color and the second color, a third contact structure located directly on a surface of the third semiconductor device layer and composed of an ohmic metal-containing material, and a third metallic layer located directly on a surface of the third contact structure and composed of a sixth magnetic material having a sixth polarity that is opposite the fifth polarity, wherein the sixth magnetic material has a magnetic force of attraction that is less than the fifth magnetic material;

transferring the third set of chiplets to the solder material that is present on the plurality of third bond pads by magnetic force of attraction between the fifth magnetic material and the sixth magnetic material; and forming, by annealing, a permanent bond between each transferred third set of chiplets and the third bond pads.

* * * * *